United States Patent
Fernando et al.

(10) Patent No.: US 10,438,876 B2
(45) Date of Patent: Oct. 8, 2019

(54) POWER QUAD FLAT NO-LEAD (PQFN) PACKAGE IN A SINGLE SHUNT INVERTER CIRCUIT

(71) Applicant: Infineon Technologies Americas Corp., El Segundo, CA (US)

(72) Inventors: Dean Fernando, Torrance, CA (US); Roel Barbosa, Sta. Rosa Laguna (PH); Toshio Takahashi, Rancho Palos Verdes, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/496,951

(22) Filed: Apr. 25, 2017

(65) Prior Publication Data

US 2017/0229383 A1    Aug. 10, 2017

Related U.S. Application Data (63) Continuation of application No. 14/102,275, filed on Dec. 10, 2013, which is a continuation-in-part of
(Continued)

(51) Int. Cl.
*H01L 23/495*    (2006.01)
*H01L 23/00*    (2006.01)
*H01L 23/31*    (2006.01)

(52) U.S. Cl.
CPC .... *H01L 23/49575* (2013.01); *H01L 23/4952* (2013.01); *H01L 23/49513* (2013.01);
(Continued)

(58) Field of Classification Search
CPC .......................... H01L 23/49575; H01L 24/06
See application file for complete search history.

(56) References Cited

U.S. PATENT DOCUMENTS 5,280,228 A * 1/1994 Kanouda ........... H02M 7/53875
                                                      318/801
5,773,883 A   6/1998 Majumdar et al.
(Continued)

FOREIGN PATENT DOCUMENTS

CN    101030733 A    9/2007
CN    201234208 Y    5/2009
(Continued)

OTHER PUBLICATIONS

Extended European Search Report from counterpart European Application No. 13199239.8, dated Oct. 11, 2017, 9 pp.
(Continued)

*Primary Examiner* — Peniel M Gumedzoe
(74) *Attorney, Agent, or Firm* — Shumaker & Sieffert, P.A.

(57) ABSTRACT

According to an exemplary implementation, a power quad flat no-lead (PQFN) package includes a driver integrated circuit (IC) situated on a leadframe. The PQFN package further includes low-side U-phase, low-side V-phase, and low-side W-phase power switches situated on the leadframe. A logic ground of the leadframe is coupled to a support logic circuit of the driver IC. A power stage ground of the leadframe is coupled to sources of the low-side U-phase, low-side V-phase, and low-side W-phase power switches. The power stage ground can further be coupled to gate drivers of the driver IC.

18 Claims, 6 Drawing Sheets

(Top View)

Related U.S. Application Data application No. 13/662,244, filed on Oct. 26, 2012, now Pat. No. 9,324,638, which is a continuation of application No. 13/034,519, filed on Feb. 24, 2011, now Pat. No. 8,587,101.

(60) Provisional application No. 61/774,484, filed on Mar. 7, 2013, provisional application No. 61/459,527, filed on Dec. 13, 2010.

(52) U.S. Cl.
CPC .. *H01L 23/49541* (2013.01); *H01L 23/49548* (2013.01); *H01L 23/49562* (2013.01); *H01L 24/06* (2013.01); H01L 23/3107 (2013.01); H01L 23/49582 (2013.01); H01L 24/29 (2013.01); H01L 24/32 (2013.01); H01L 24/45 (2013.01); H01L 24/48 (2013.01); H01L 24/49 (2013.01); H01L 24/73 (2013.01); H01L 2224/05554 (2013.01); H01L 2224/0603 (2013.01); H01L 2224/2929 (2013.01); H01L 2224/29101 (2013.01); H01L 2224/29339 (2013.01); H01L 2224/32245 (2013.01); H01L 2224/45015 (2013.01); H01L 2224/45144 (2013.01); H01L 2224/45147 (2013.01); H01L 2224/48091 (2013.01); H01L 2224/48137 (2013.01); H01L 2224/48247 (2013.01); H01L 2224/4903 (2013.01); H01L 2224/49111 (2013.01); H01L 2224/49113 (2013.01); H01L 2224/49171 (2013.01); H01L 2224/49175 (2013.01); H01L 2224/73265 (2013.01); H01L 2924/014 (2013.01); H01L 2924/01005 (2013.01); H01L 2924/0105 (2013.01); H01L 2924/01006 (2013.01); H01L 2924/01029 (2013.01); H01L 2924/01033 (2013.01); H01L 2924/01047 (2013.01); H01L 2924/01079 (2013.01); H01L 2924/01082 (2013.01); H01L 2924/0781 (2013.01); H01L 2924/1305 (2013.01); H01L 2924/1306 (2013.01); H01L 2924/13055 (2013.01); H01L 2924/13064 (2013.01); H01L 2924/13091 (2013.01); H01L 2924/181 (2013.01); H01L 2924/18301 (2013.01); H01L 2924/3011 (2013.01); H01L 2924/30111 (2013.01)

(56) References Cited

U.S. PATENT DOCUMENTS

| | | |
|---|---|---|
| 5,998,856 A | 12/1999 | Noda et al. |
| 6,137,165 A | 10/2000 | Thierry |
| 6,211,549 B1 | 4/2001 | Funaki et al. |
| 6,249,024 B1 | 6/2001 | Mangtani |
| 6,313,598 B1 | 11/2001 | Tamba et al. |
| 6,465,875 B2 | 10/2002 | Connah et al. |
| 6,610,923 B1 | 8/2003 | Nagashima et al. |
| 7,067,413 B2 | 6/2006 | Kim et al. |
| 7,109,577 B2 | 9/2006 | Shiraishi et al. |
| 7,145,224 B2 | 12/2006 | Kawashima et al. |
| 7,436,070 B2 | 10/2008 | Uno et al. |
| 7,554,181 B2 | 6/2009 | Satou et al. |
| 7,659,144 B2 | 2/2010 | Shirai et al. |
| 7,679,173 B2 | 3/2010 | Uno et al. |
| 7,687,902 B2 | 3/2010 | Shiraishi et al. |
| 8,040,708 B2 | 10/2011 | Sato et al. |
| 8,063,616 B2 * | 11/2011 | Bahramian ............ H02M 1/08 323/271 |
| 8,134,240 B2 | 3/2012 | Nishimura et al. |
| 8,587,101 B2 | 11/2013 | Fernando et al. |
| 8,803,499 B2 | 8/2014 | Sreenivas et al. |
| 9,324,638 B2 | 4/2016 | Fernando et al. |
| 9,324,646 B2 | 4/2016 | Fernando et al. |
| 9,355,995 B2 | 5/2016 | Fernando et al. |
| 9,362,215 B2 | 6/2016 | Fernando et al. |
| 9,412,701 B2 | 8/2016 | Satou et al. |
| 9,443,795 B2 | 9/2016 | Fernando et al. |
| 9,449,957 B2 | 9/2016 | Fernando et al. |
| 9,524,928 B2 | 12/2016 | Fernando et al. |
| 9,530,724 B2 | 12/2016 | Fernando et al. |
| 9,620,954 B2 | 4/2017 | Fernando et al. |
| 2001/0015676 A1 | 8/2001 | Takikawa et al. |
| 2001/0045627 A1 | 11/2001 | Connah et al. |
| 2002/0109211 A1 | 8/2002 | Shinohara |
| 2002/0113617 A1 | 8/2002 | Gergintschw et al. |
| 2003/0006434 A1 | 1/2003 | Kawafuji et al. |
| 2003/0107120 A1 | 6/2003 | Connah et al. |
| 2004/0135248 A1 | 7/2004 | Takagawa et al. |
| 2004/0196678 A1 | 10/2004 | Yoshimura et al. |
| 2004/0227476 A1 | 11/2004 | Guerra et al. |
| 2004/0227547 A1 | 11/2004 | Shiraishi et al. |
| 2005/0054186 A1 | 3/2005 | Kim et al. |
| 2005/0231990 A1 | 10/2005 | Uno et al. |
| 2006/0001318 A1 | 1/2006 | Ahmad et al. |
| 2006/0022298 A1 | 2/2006 | Shiraishi et al. |
| 2006/0043545 A1 | 3/2006 | Yea et al. |
| 2006/0113664 A1 | 6/2006 | Shiraishi et al. |
| 2006/0175627 A1 | 8/2006 | Shiraishi |
| 2006/0240599 A1 | 10/2006 | Amano et al. |
| 2007/0064370 A1 | 3/2007 | Kajiwara |
| 2007/0116553 A1 | 5/2007 | Chen et al. |
| 2007/0126092 A1 | 6/2007 | San Antonio et al. |
| 2007/0196950 A1 | 8/2007 | Shirai et al. |
| 2007/0200537 A1 | 8/2007 | Akiyama et al. |
| 2007/0216011 A1 | 9/2007 | Otremba et al. |
| 2007/0228534 A1 | 10/2007 | Uno et al. |
| 2008/0002445 A1 | 1/2008 | Cho et al. |
| 2008/0023831 A1 | 1/2008 | Nishimura et al. |
| 2008/0074068 A1 | 3/2008 | Takeuchi |
| 2008/0150436 A1 | 6/2008 | Suzuki |
| 2008/0217662 A1 | 9/2008 | Harnden et al. |
| 2008/0224323 A1 | 9/2008 | Otremba |
| 2008/0252372 A1 | 10/2008 | Williams |
| 2009/0095979 A1 | 4/2009 | Saito et al. |
| 2009/0189261 A1 | 7/2009 | Lim et al. |
| 2009/0212733 A1 | 8/2009 | Hsieh et al. |
| 2009/0261462 A1 | 10/2009 | Gomez |
| 2009/0262468 A1 | 10/2009 | Ide et al. |
| 2009/0309634 A1 | 12/2009 | Yang et al. |
| 2009/0321927 A1 | 12/2009 | Nishimura et al. |
| 2010/0059875 A1 | 3/2010 | Sato et al. |
| 2010/0127683 A1 | 5/2010 | Uno et al. |
| 2010/0148590 A1 | 6/2010 | Kojima |
| 2010/0164419 A1 | 7/2010 | Suh |
| 2010/0165681 A1 | 7/2010 | Sakano et al. |
| 2010/0301464 A1 | 12/2010 | Arshad |
| 2011/0049685 A1 | 3/2011 | Park et al. |
| 2011/0110011 A1 | 5/2011 | Dittfeld et al. |
| 2011/0157949 A1 * | 6/2011 | Bahramian ............ H02M 1/08 363/132 |
| 2011/0169102 A1 | 7/2011 | Uno et al. |
| 2011/0188218 A1 * | 8/2011 | Hsing ............ H01R 9/00 361/772 |
| 2011/0254143 A1 | 10/2011 | Chen et al. |
| 2012/0126378 A1 | 5/2012 | San Antonio et al. |
| 2012/0146205 A1 | 6/2012 | Fernando et al. |
| 2012/0256193 A1 | 10/2012 | Herbert et al. |
| 2012/0267750 A1 | 10/2012 | Imai et al. |
| 2012/0273892 A1 | 11/2012 | Uno et al. |
| 2012/0301360 A1 * | 11/2012 | Meinhold ............ B01J 20/28047 422/68.1 |
| 2013/0009299 A1 * | 1/2013 | Takada ............ H01L 23/49503 257/676 |
| 2013/0155745 A1 | 6/2013 | Tanaka et al. |
| 2013/0182470 A1 * | 7/2013 | Chen ............ H02M 7/537 363/56.01 |
| 2014/0015586 A1 * | 1/2014 | Hirler ............ H01L 29/42372 327/333 |

(56) References Cited

U.S. PATENT DOCUMENTS

| | | |
|---|---|---|
| 2014/0061885 A1 | 3/2014 | Fernando et al. |
| 2014/0097531 A1 | 4/2014 | Fernando et al. |
| 2014/0131846 A1 | 5/2014 | Shiramizu et al. |

FOREIGN PATENT DOCUMENTS

| | | | |
|---|---|---|---|
| CN | 101577482 A | | 11/2009 |
| CN | 101582415 A | | 11/2009 |
| CN | 201928197 U | | 8/2011 |
| CN | 102569241 A | | 7/2012 |
| EP | 2463904 | | 6/2012 |
| JP | H9102580 A | | 4/1997 |
| JP | H09191659 A | | 7/1997 |
| JP | 2000091499 A | | 3/2000 |
| JP | 2001135765 A | | 5/2001 |
| JP | 3384399 A | | 1/2002 |
| JP | 2003018862 A | | 1/2003 |
| JP | 2004147401 A | | 5/2004 |
| JP | 2004342735 A | | 12/2004 |
| JP | 2005086200 A | | 3/2005 |
| JP | 2005183463 A | | 7/2005 |
| JP | 2005217072 A | | 8/2005 |
| JP | 2005294464 A | | 10/2005 |
| JP | 2006049341 A | | 2/2006 |
| JP | 2006512040 A | | 4/2006 |
| JP | 2007227416 A | | 9/2007 |
| JP | 2007266218 A | | 10/2007 |
| JP | 2008017620 A | | 1/2008 |
| JP | 2008034567 A | | 2/2008 |
| JP | 2010067755 A | | 3/2010 |
| JP | 201129262 A | | 2/2011 |
| JP | 200927090 A | | 1/2012 |
| JP | 2012129489 A | | 7/2012 |
| JP | 2012175070 A | | 9/2012 |
| KR | 20030063835 A | | 7/2003 |
| KR | 20060045597 A | | 5/2006 |
| TW | 201240046 A | | 10/2012 |
| WO | 9824128 A1 | | 6/1998 |
| WO | 2006003751 A1 | | 1/2006 |

OTHER PUBLICATIONS

Decision to Grant, in the Japanese, from counterpart Japanese Patent Application No. 2014-011594, dated Oct. 3, 2017, 2 pp.

Office Action, in the Chinese language, from counterpart Chinese Application No. 201410039117.0, dated Jun. 3, 2016, 7 pp.

Notification of Reasons for Refusal, and translation thereof, counterpart Japanese Application No. 2014-11594, dated Mar. 7, 2017, 14 pp.

Pre-Appeal Examination Report, and translation thereof, from counterpart Japanese Application No. 2014-011594, dated Jul. 26, 2016, 4 pp.

Prosecution History from U.S. Appl. No. 13/034,519, dated from Aug. 16, 2012 through Oct. 18, 2013, 69 pp.

Prosecution History from U.S. Appl. No. 13/662,244, dated from Oct. 30 through Mar. 30, 2016, 182 pp.

Prosecution History from U.S. Appl. No. 14/102,275, dated from May 8, 2015 through Jan. 23, 2017, 142 pp.

Office Action, in the Chinese language, from counterpart Chinese Application No. 201710493835.9, dated Mar. 1, 2019, 9 pp.

* cited by examiner

Fig. 2A (Top View)

Fig. 2B (Top View)

Fig. 2D

POWER QUAD FLAT NO-LEAD (PQFN) PACKAGE IN A SINGLE SHUNT INVERTER CIRCUIT

CROSS-REFERENCE TO RELATED APPLICATIONS

The present application is a continuation of U.S. Nonprovisional patent application Ser. No. 14/102,275, filed Dec. 10, 2013, now U.S. Pat. No. 9,659,845, which claims the benefit of and priority to U.S. Provisional Patent Application Ser. No. 61/774,484, filed Mar. 7, 2013, and which is a continuation-in-part of U.S. Nonprovisional patent application Ser. No. 13/662,244, filed Oct. 26, 2012, now U.S. Pat. No. 9,324,638, which claims priority to U.S. Nonprovisional patent application Ser. No. 13/034,519, filed Feb. 24, 2011, now U.S. Pat. No. 8,587,101, which claims the benefit of and priority to U.S. Provisional Patent Application Ser. No. 61/459,527, filed Dec. 13, 2010, entire contents of each one of which is hereby incorporated by reference.

BACKGROUND

I. Definition

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

II. Background Art

Packages combining several semiconductor devices can simplify circuit design, reduce costs, and provide greater efficiency and improved performance by keeping related and dependent circuit components in close proximity. Furthermore, these packages can facilitate application integration and greater electrical and thermal performance compared to using separate packaging for components.

Quad flat no-lead (QFN) packages are leadless packages for electrical components, such as power semiconductor devices. The QFN packages can utilize a leadframe and wirebonds for connection to the electrical components housed therein. The QFN packages often have limited complexity and electrical routing can be challenging, particularly for more complex configurations. Thus, QFN packages often have simple configurations and house a small number of electrical components.

SUMMARY

A power quad flat no-lead (PQFN) package in a single shunt inverter circuit, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
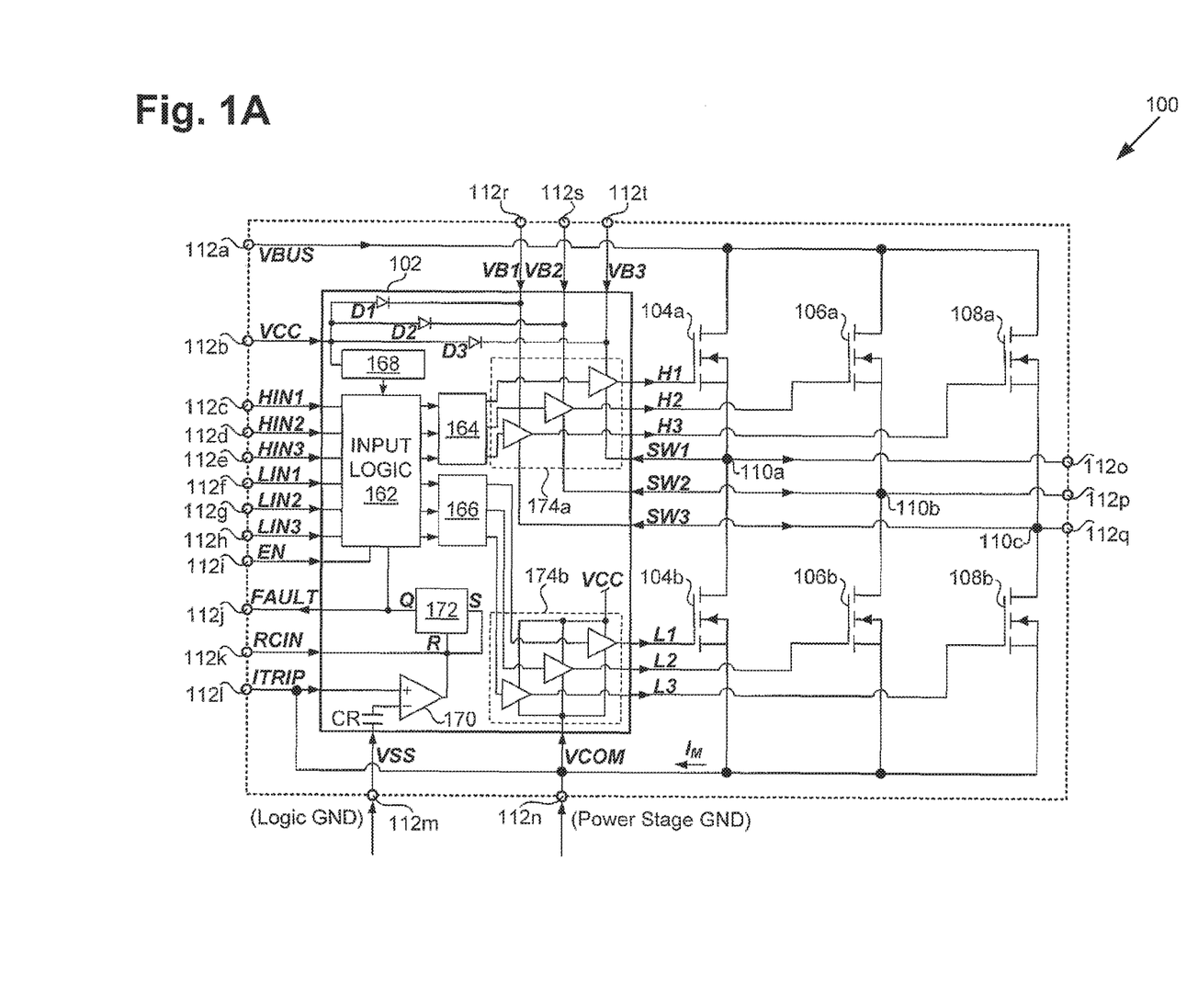
FIG. 1A illustrates a schematic diagram of an exemplary circuit of a power quad flat no-lead (PQFN) package.
Figure 1B:
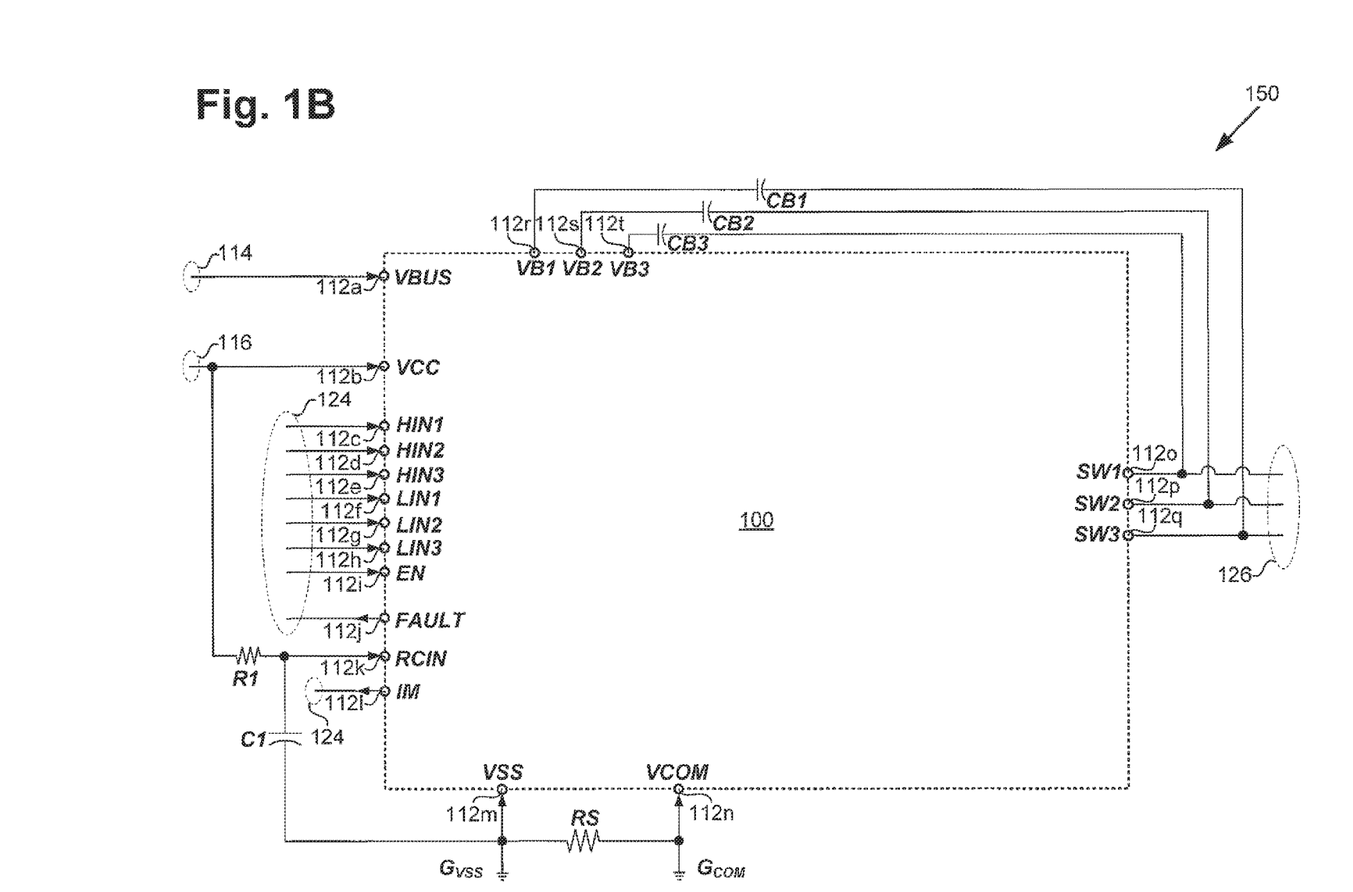
FIG. 1B illustrates a schematic diagram of a PQFN package in an exemplary single shunt inverter circuit.

FIG. 1A illustrates a schematic diagram of an exemplary circuit of power quad flat no-lead (PQFN) package 100. FIG. 1B illustrates a schematic diagram of PQFN package 100 in single shunt inverter circuit 150.

Referring to FIGS. 1A and 1B, PQFN package 100 includes driver integrated circuit (IC) 102, U-phase power switches 104a and 104b, V-phase power switches 106a and 106b, and W-phase power switches 108a and 108b. Driver IC 102 includes input logic 162, level shifter 164, undervoltage protection circuit 168, comparator 170, latch 172, gate drivers 174a, gate drivers 174b, capacitor CR, and bootstrap diodes D1, D2, and D3.

In single shunt inverter circuit 150 of FIG. 1B, PQFN package 100 is connected to bus voltage source 114, supply voltage source 116, microcontroller 124, motor 126, resistor R1, capacitor C1, bootstrap capacitors CB1, CB2, CB3, and shunt RS. Any of PQFN package 100, microcontroller 124, motor 126, resistor R1, capacitor C, bootstrap capacitors CB1, CB2, CB3, and shunt RS can be mounted on a printed circuit board (PCB). Furthermore, PQFN package 100 can be connected to any of bus voltage source 114, supply voltage source 116, microcontroller 124, motor 126, resistor R1, capacitor C1, bootstrap capacitors CB1, CB2, CB3, and shunt RS through conductive leads on the PCB.

PQFN package 100 also includes VBUS terminal 112*a*, VCC terminal 112*b*, HIN1 terminal 112*c*, HIN2 terminal 112*d*, HIN3 terminal 112*e*, LIN1 terminal 112*f*, LIN2 terminal 112*g*, LIN3 terminal 112*h*, EN terminal 112*i*, FAULT terminal 112*j*, RCIN terminal 112*k*, IM terminal 112*l*, VSS terminal 112*m*, VCOM terminal 112*n*, SW1 terminal 112*o*, SW2 terminal 112*p*, SW3 terminal 112*q*, VB1 terminal 112*r*, VB2 terminal 112*s*, and VB3 terminal 112*t*, which are collectively referred to as I/O terminals 112.

In PQFN package 100, VBUS terminal 112*a* receives VBUS as input from bus voltage source 114. VCC terminal 112*b* receives VCC as input to driver IC 102 from supply voltage source 116. HIN1 terminal 112*c*, HIN2 terminal 112*d*, and HIN3 terminal 112*e* receive HIN1, HIN2, and HIN3 respectively as inputs to driver IC 102 from microcontroller 124. LIN1 terminal 112*f*, LIN2 terminal 112*g*, and LIN3 terminal 112*h* receive LIN1, LIN2, and LIN3 respectively as inputs to driver IC 102 from microcontroller 124. EN terminal 112*i* receives EN as input to driver IC 102 from microcontroller 124. FAULT terminal 112*j* receives FAULT as output from driver IC 102 to microcontroller 124. RCIN terminal 112*k* receives RCIN as input to driver IC 102 from resistor R1 and capacitor C1. IM terminal 112*l* receives ITRIP as input to driver IC 102 and microcontroller 124 from U-phase power switch 104*b*, V-phase power switch 106*b*, and W-phase power switch 108*b*. VSS terminal 112*m* receives VSS as input to driver IC 102 from logic ground $G_{VSS}$. VCOM terminal 112*n* receives VCOM as input to driver IC 102, U-phase power switch 104*b*, V-phase power switch 106*b*, and W-phase power switch 108*b* from power stage ground $G_{COM}$. SW1 terminal 112*o* receives SW1 from U-phase output node 110*a* as output to motor 126. Driver IC 102 also receives SW1 as input from U-phase output node 110*a*. SW2 terminal 112*p* receives SW2 from V-phase output node 110*b* as output to motor 126. Driver IC 102 also receives SW2 as input from V-phase output node 110*b*. SW3 terminal 112*q* receives SW3 from W-phase output node 110*c* as output to motor 126. Driver IC 102 also receives SW3 as input from W-phase output node 110*c*. VB1 terminal 112*r* receives VB1 as input to driver IC 102 from bootstrap capacitor CB1. VB2 terminal 112*s* receives VB2 as input to driver IC 102 from bootstrap capacitor CB2. VB3 terminal 112*t* receives VB3 as input to driver IC 102 from bootstrap capacitor CB3.

It will be appreciated that in various implementations, the number, quantity, and location of I/O terminals 112 are different than what is shown. For example, in various implementations, a driver IC that is different than driver IC 102 can be utilized, which can have different capabilities and/or I/O requirements than driver IC 102. This may be reflected in I/O terminals 112 as well as other connections of PQFN package 100. As one specific example, in one implementation, driver IC 102 is instead a functionally integrated IC that incorporates functionality of driver IC 102 and microcontroller 124. Thus, additional I/O terminals 112 may be required for functionality of microcontroller 124, while certain I/O terminals 112, such as FAULT terminal 112*j* may not be required.

PQFN package 100 is for a multi-phase power inverter and driver IC 102 can be a high voltage IC (HVIC) for driving U-phase power switches 104*a* and 104*b*, V-phase power switches 106*a* and 106*b*, and W-phase power switches 108*a* and 108*b*, which are in a full bridge configuration. Examples of driver IC 102 include "5$^{th}$ generation" HVICs available from International Rectifier Corporation®. In the present implementation, U-phase power switches 104*a* and 104*b*, V-phase power switches 106*a* and 106*b*, and W-phase power switches 108*a* and 108*b* are vertical conduction power devices, for example, group IV semiconductor power metal-oxide-semiconductor field effect transistors (power MOSFETs) such as fast-reverse epitaxial diode field effect transistors (FREDFETs), or group IV semiconductor insulated-gate bipolar transistors (IGBTs). In other implementations group III-V semiconductor FETs, HEMTs (high electron mobility transistors) and, in particular, GaN FETs and/or HEMTs can be used as power devices in U-phase power switches 104*a* and 104*b*, V-phase power switches 106*a* and 106*b*, and W-phase power switches 108*a* and 108*b*. As defined above, Gallium nitride or GaN, as used herein, refers to a III-Nitride compound semiconductor wherein the group III element or elements include some or a substantial amount of gallium, but may also include other group III elements in addition to gallium. As previously stated, a group III-V or a GaN transistor may also refer to a composite high voltage enhancement mode transistor that is formed by connecting the group III-V or the GaN transistor in cascode with a lower voltage group IV transistor. While PQFN package 100 provides a full bridge power device, alternative implementations can provide other package configurations as required by the particular application.

In PQFN package 100, HIN1, HIN2, and HIN3 are control signals for U-phase power switch 104*a*, V-phase power switch 106*a*, and W-phase power switch 108*a*, which are high side transistors. Input logic 162 receives HIN1, HIN2, and HIN3, which are respectively provided to level shifter 164. In the present implementation, level shifter 164 is a high-voltage level shifter having termination that can sustain, for example, approximately 600 volts. Level shifted versions of HIN1, HIN2, and HIN3 are received by gate drivers 174*a* to provide high side gate signals H1, H2, and H3 to U-phase power switch 104*a*, V-phase power switch 106*a*, and W-phase power switch 108*a*, as shown in FIG. 1A. Gate drivers 174*a* further receives SW1, SW2, and SW3 from U-phase output node 110*a*, V-phase output node 110*b*, and W-phase output node 110*c* respectively. Driver IC 102 thereby generates high side gate signals H1, H2, and H3 from HIN1, HIN2, and HIN3 respectively.

Similarly, LIN1, LIN2, and LIN3 are control signals for U-phase power switch 104*b*, V-phase power switch 106*b*, and W-phase power switch 108*b*, which are low side transistors. Input logic 162 receives LIN1, LIN2, and LIN3, which are respectively provided to level shifter 166. In the present implementation, level shifter 166 is a low-voltage level shifter, which compensates for differences between logic ground $G_{VSS}$ and power stage ground $G_{COM}$. This can be, for example, approximately one to approximately two volts. Level shifted versions of LIN1, LIN2, and LIN3 are respectively provided to gate drivers 174*b* to provide low side gate signals L1, L2, and L3 to U-phase power switch 104*b*, V-phase power switch 106*b*, and W-phase power switch 108*b*, as shown in FIG. 1A. Driver IC 102 thereby generates low side gate signals L1, L2, and L3 from LIN1, LIN2, and LIN3 respectively.

Driver IC 102 can thereby drive switching of U-phase power switches 104*a* and 104*b*, V-phase power switches 106*a* and 106*b*, and W-phase power switches 108*a* and 108*b* using gate drivers 174*a* and 174*b* to power motor 126, which generates motor current $I_M$. In the present implementation, gate drivers 174a and 174b are impedance matched to respective ones of U-phase power switches 104a and 104b, V-phase power switches 106a and 106b, and W-phase power switches 108a and 108b. Gate drivers 174a and 174b can thereby drive U-phase power switches 104a and 104b, V-phase power switches 106a and 106b, and W-phase power switches 108a and 108b without gate resistors which allows PQFN package 100 to be smaller.

VBUS is a bus voltage from bus voltage source 114, which is coupled to respective drains of U-phase power switch 104a, V-phase power switch 106a, and W-phase power switch 108a. As one example, bus voltage source 114 can be an AC to DC rectifier. The AC can be, as one example, an outlet voltage, such as 230 volts. The DC voltage can be, for example, approximately 300 volts to approximately 400 volts for VBUS.

VCC is a supply voltage for driver IC 102 from supply voltage source 116, which can be, for example, approximately 15 volts. As shown in FIG. 1A, gate drivers 174b are powered by VCC. In some implementations, supply voltage source 116 generates VCC from VBUS. VB1, VB2, and VB3 are bootstrap voltages for driver IC 102 and are provided by bootstrap capacitors CB1, CB2, and CB3 respectively. Bootstrap capacitors CB1, CB2, and CB3 can be charged, for example, by VCC through bootstrap diodes D1, D2, and D3 respectively. Bootstrap capacitor CB1 is coupled between VB1 terminal 112r and SW3 terminal 112q. Bootstrap capacitor CB2 is coupled between VB2 terminal 112s and SW2 terminal 112p. Bootstrap capacitor CB3 is coupled between VB3 terminal 112t and SW1 terminal 112o.

In the implementation shown, VCC is coupled to undervoltage protection circuit 168. Undervoltage protection circuit 168 detects an undervoltage condition when VCC falls below a threshold voltage, such as approximately 9 volts. VCC notifies input logic 162 of the undervoltage condition to thereby disable switching in driver IC 102. Switching in driver IC 102 can also be altered using EN. EN can be used, by microcontroller 124, to enable switching of driver IC 102. More particularly, driver IC 102 is configured to enable switching of H1, H2, H3, L1, L2, and L3 responsive to EN.

FIG. 1A shows motor current $I_M$ provided to driver IC 102 as ITRIP. Driver IC 102 utilizes ITRIP for overcurrent protection. For example, FIG. 1A shows comparator 170 comparing ITRIP to a reference voltage that is generated by capacitor CR. If ITRIP exceeds the reference voltage, comparator 170 triggers latch 172, which indicates an overcurrent condition to microcontroller 124 by providing FAULT to FAULT terminal 112j. Input logic 162 also receives FAULT to disable switching of driver IC 102. Driver IC 102 utilizes RCIN to automatically reset latch 172 from the overcurrent protection. As shown in FIG. 1B, resistor R1 is coupled between VCC terminal 112b and RCIN terminal 112k to charge capacitor C1. Capacitor C1 is coupled between RCIN terminal 112k and VSS terminal 112m. Resistor R1 and capacitor C1 can be changed to alter timing of automatic reset for the overcurrent protection.

VSS is a logic ground of a support logic circuit of driver IC 102 from logic ground $G_{VSS}$. As one example, FIG. 1A shows VSS as a logic ground for capacitor CR. VSS is also a logic ground for other components of the support logic circuit, which includes input logic 162, level shifter 164, undervoltage protection circuit 168, comparator 170, latch 172, and capacitor CR, but can include different components. VCOM is a power stage ground of U-phase power switches 104a and 104b, V-phase power switches 106a and 106b, and W-phase power switches 108a and 108b from power stage ground $G_{COM}$. FIG. 1A shows VCOM connected to sources of U-phase power switches 104a and 104b, V-phase power switches 106a and 106b, and W-phase power switches 108a and 108b within package 100. VCOM can also be for driver IC 102. As shown in FIG. 1A, VCOM coupled to gate drivers 174b of driver IC 102.

A logic ground separate from a power stage ground provided is for in single shunt inverter circuit 150 using shunt RS. Shunt RS is coupled across VSS terminal 112m and VCOM terminal 112n. Shunt RS is also coupled to sources of each of U-phase power switch 104b, V-phase power switch 106b, and W-phase power switch 108b through VCOM terminal 112n. Thus, motor current $I_M$ from motor 126, shown in FIG. 1A, is combined phase current from U-phase power switch 104b, V-phase power switch 106b, and W-phase power switch 108b. Motor current $I_M$ is provided to microcontroller 124 through IM terminal 112l. Microcontroller 124 utilizes motor current $I_M$ to reconstruct individual phase currents (U, V, and W) to control pulse-width modulation (PWM) by controlling HIN1, HIN2, HIN3, LIN1, LIN2, and LIN3.

Thus, in the present implementation, PQFN package 100 has a logic ground separate from a power stage ground. During switching of U-phase power switches 104a and 104b, V-phase power switches 106a and 106b, and W-phase power switches 108a and 108b, a voltage can develop across shunt RS. By having a logic ground separate from a power stage ground, VCC for the support logic circuit can be made with respect to ground instead of the voltage across shunt RS. Thus, by using separate grounds, PQFN package 100 is protected from latch up and noise malfunction, which otherwise can be caused by excess switching voltages from U-phase power switches 104a and 104b, V-phase power switches 106a and 106b, and W-phase power switches 108a and 108b.

Typical QFN packages have limited complexity with simple configurations and a small number of electrical components. For more complex configurations, it would be difficult to rout wires for connections while avoiding wire crossing and wire shorting. Moreover, long lengths of wiring would adversely affect electrical and thermal performance. However, PQFN packages, in accordance with various implementations of the present disclosure, can be substantially more complex than typical QFN packages while avoiding wire crossing and wire shorting and achieving high electrical and thermal performance. Furthermore, the PQFN packages can achieve a logic ground separate from a power stage ground in single shunt inverter circuit.

Figure 2A:
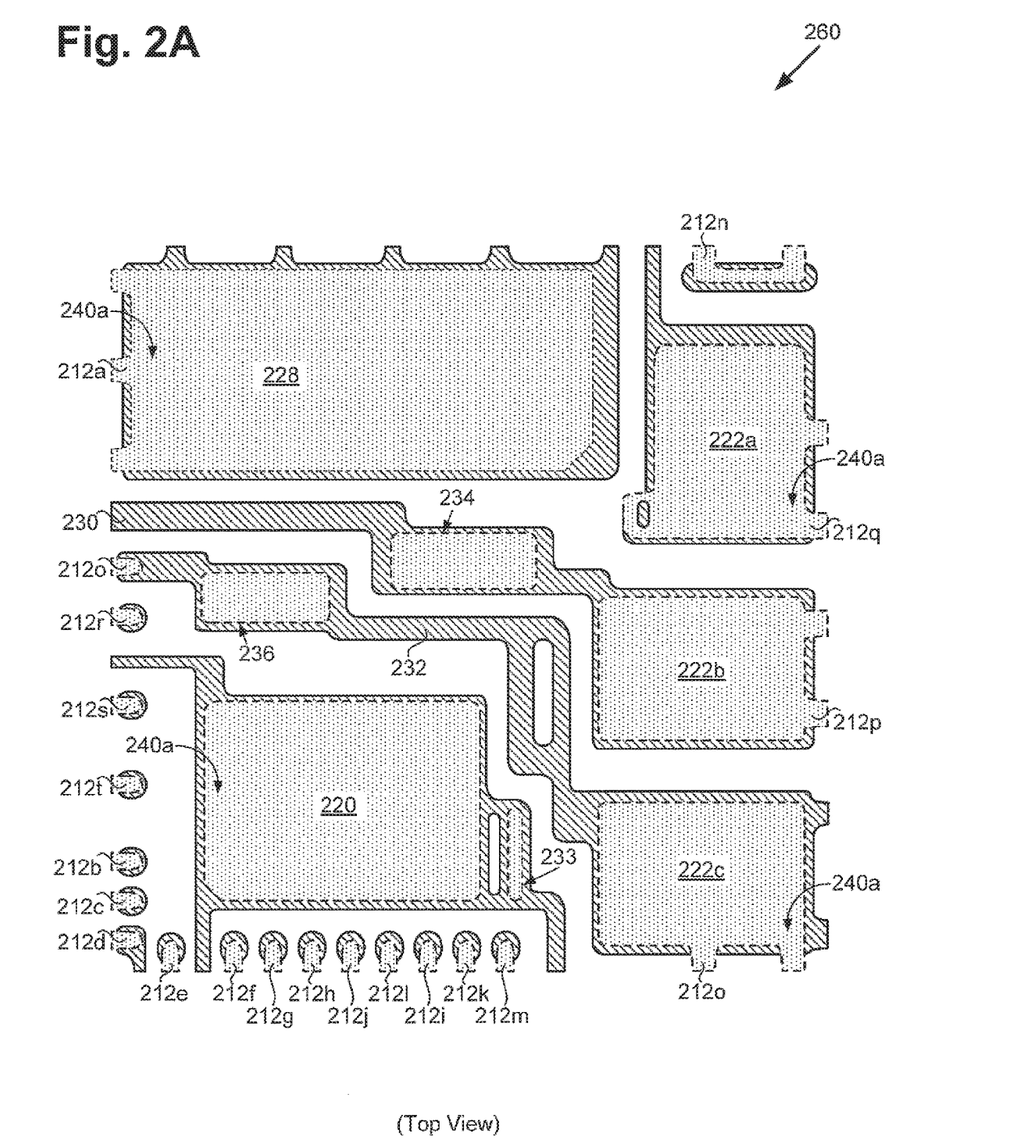
FIG. 2A illustrates a top-plan view of a leadframe of an exemplary PQFN package.
Figure 2B:
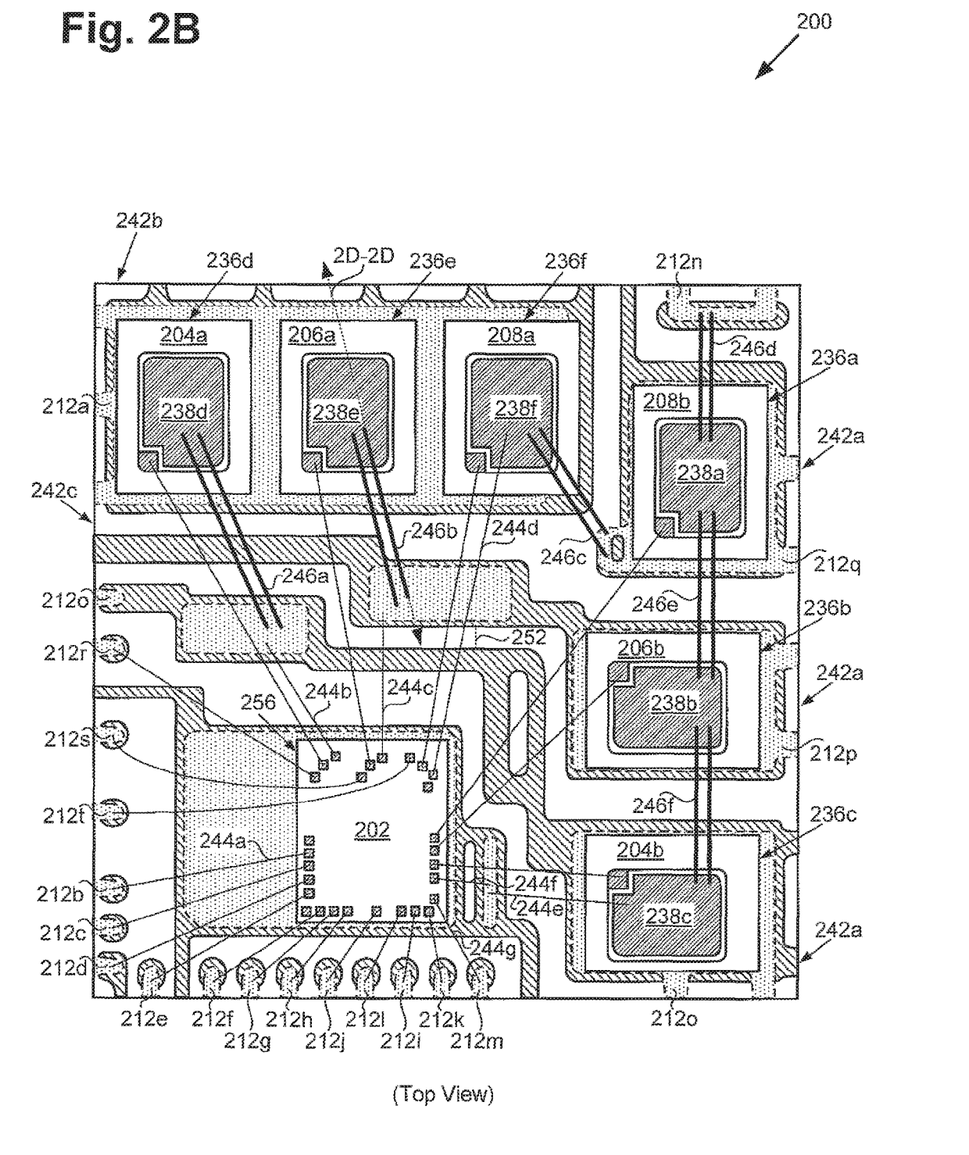
FIG. 2B illustrates a top-plan view of an exemplary PQFN package with wirebonds.
Figure 2C:
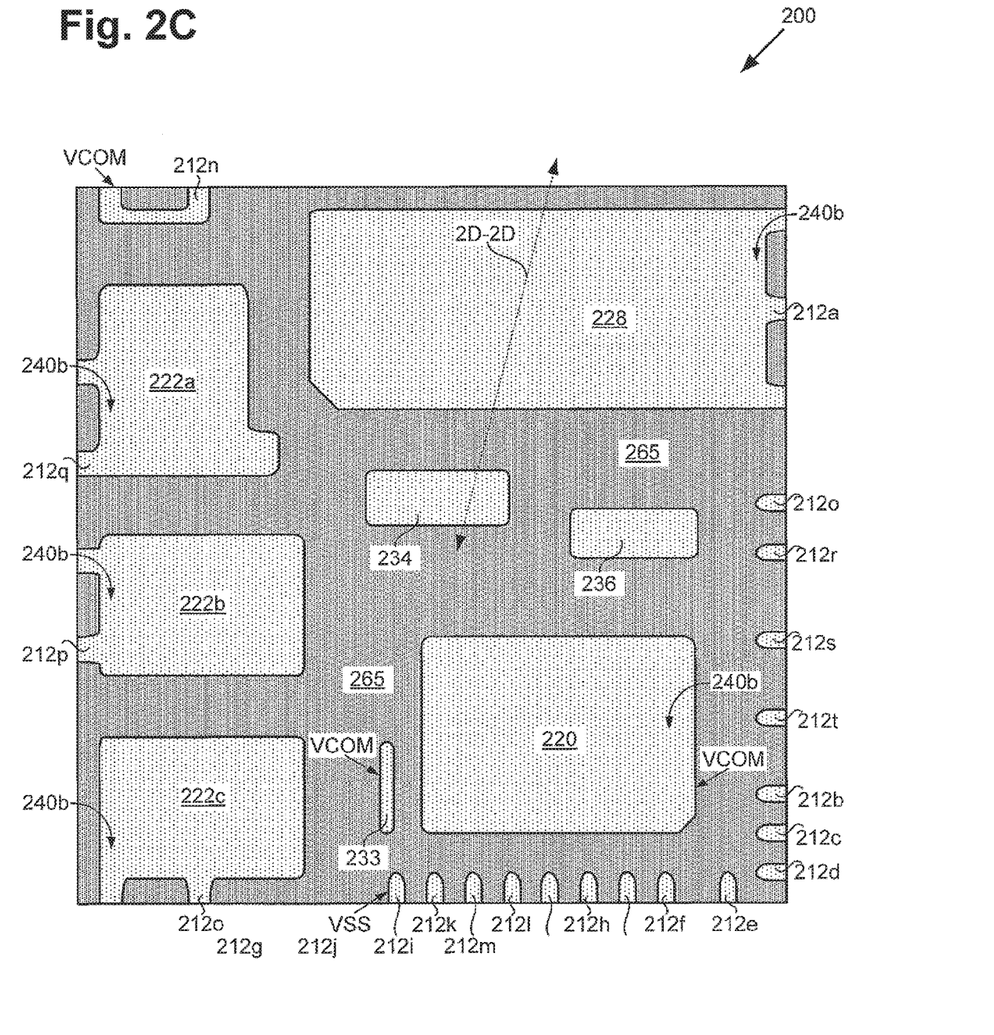
FIG. 2C illustrates a bottom-plan view of an exemplary PQFN package.

Turning to FIGS. 2A, 2B, and 2C, FIG. 2A illustrates a top-plan view of a leadframe of PQFN package 200 of FIGS. 2B and 2C. FIG. 2B illustrates a top-plan view of PQFN package 200. FIG. 2C illustrates a bottom-plan view of PQFN package 200. In the present implementation, PQFN package 200 is a multi-chip module (MCM) PQFN package, which can have a footprint of approximately 12 mm by approximately 12 mm. In other implementations, PQFN package 200 can have a footprint of greater than 12 mm by 12 mm. In still other implementations, PQFN package 200 can have a footprint of less than 12 mm by 12 mm.

PQFN package 200 corresponds to PQFN package 100 in FIGS. 1A and 1B. For example, PQFN package 200 includes driver IC 202, U-phase power switches 204a and 204b, V-phase power switches 206a and 206b, and W-phase power switches 208a and 208b corresponding respectively to driver IC 102, U-phase power switches 104a and 104b, V-phase power switches 106a and 106b, and W-phase power switches 108a and 108b in FIG. 1A. Furthermore, PQFN package 200 includes VBUS terminal 212a, VCC terminal 212b, HIN1 terminal 212c, HIN2 terminal 212d, HIN3 terminal 212e, LIN1 terminal 212f, LIN2 terminal 212g, LIN3 terminal 212h, EN terminal 212i, FAULT terminal 212j, RCIN terminal 212k, IM terminal 212l, VSS terminal 212m (also referred to as "logic ground terminal 112m"), VCOM terminal 212n (also referred to as "power stage ground terminal 112n"), SW1 terminal 212o (also referred to as "U-phase output terminal 212o"), SW2 terminal 212p (also referred to as "V-phase output terminal 212p"), SW3 terminal 212q (also referred to as "W-phase output terminal 212q"), VB1 terminal 212r, VB2 terminal 212s, and VB3 terminal 212t (also referred to as "I/O terminals 212") corresponding respectively to VBUS terminal 112a, VCC terminal 112b, HIN1 terminal 112c, HIN2 terminal 112d, HIN3 terminal 112e, LIN1 terminal 112f, LIN2 terminal 112g, LIN3 terminal 112h, EN terminal 112i, FAULT terminal 112j, RCIN terminal 112k, IM terminal 112l, VSS terminal 112m, VCOM terminal 112n, SW1 terminal 112o, SW2 terminal 112p, SW3 terminal 112q, VB1 terminal 112r, VB2 terminal 112s, and VB3 terminal 112t in PQFN package 100.

FIG. 2A shows leadframe 260 including driver IC die pad 220, W-phase die pad 222a, V-phase die pad 222b, U-phase die pad 222c, common die pad 228. Leadframe island 233 is electrically and mechanically connected (e.g. integrally connected) to driver IC die pad 220. Leadframe 260 further includes leadframe strips 230 and 232 and I/O terminals 212. Leadframe island 234 is on leadframe strip 230 of leadframe 260 and leadframe strip 230 is electrically and mechanically connected (e.g. integrally connected) to V-phase die pad 222b of leadframe 260. Leadframe island 236 is on leadframe strip 232 of leadframe 260 and leadframe strip 232 is electrically and mechanically connected (e.g. integrally connected) to U-phase die pad 222c of leadframe 260. As shown in FIG. 2B, leadframe strips 230 and 232 can optionally extend to edge 242c of PQFN package 200. In doing so, any of leadframe strips 230 and 232 can provide, for example, additional I/O terminals for PQFN package 200. For example, leadframe strip 232 is shown as providing an additional SW1 terminal 212o at edge 242c of PQFN package 200.

Leadframe 260 can comprise a material with high thermal and electrical conductivity such as copper (Cu) alloy C194 available from Olin Brass®. Top-side 240a of leadframe 260 can be selectively plated with materials for enhanced adhesion to device dies and wires. The plating can comprise silver (Ag) plating that is selectively applied to leadframe 260, which is available from companies such as QPL Limited.

FIGS. 2A and 2B show that leadframe 260 is an etched leadframe, such as a half-etched leadframe. Portions of leadframe 260, which are unetched (e.g. not half-etched) are indicated in FIGS. 2A and 2B using dashed lines. Leadframe islands 233, 234, and 236 are examples of such unetched portions. For example, FIG. 2C shows bottom-side 240b of leadframe 260 (which also corresponds to a bottom-side of PQFN package 200).

FIG. 2C further shows mold compound 265 of PQFN package 200, which covers etched portions of leadframe 260. Mold compound 265 can be a plastic that has a low flexural modulus, such as CEL9220ZHF10 (v79) available from Hitachi® Chemical. To provide resilience against package cracking, the height (or thickness) of PQFN package 200 as defined by mold compound 265 may be kept thin, such as 0.9 mm or less.

I/O terminals 212, leadframe island 233, leadframe island 234, and leadframe island 236 are unetched and are exposed through mold compound 265 on bottom-side 240b of leadframe 260 (which also corresponds to a bottom-side of PQFN package 200). As such, I/O terminals 212, leadframe island 233, leadframe island 234 and leadframe island 236 are exposed on bottom-side 240b of leadframe 260 for high electrical conductivity and/or thermal dissipation. By providing a (PCB) with matching lands, this feature can optionally be exploited. The exposed areas of leadframe 260 can be plated, for example with Tin (Sn).

Driver IC 202, U-phase power switches 204a and 204b, V-phase power switches 206a and 206b, and W-phase power switches 208a and 208b are interconnected utilizing wirebonds and leadframe 260.

FIG. 2B shows that U-phase power switches 204a and 204b, V-phase power switches 206a and 206b, W-phase power switches 208a and 208b, and driver IC 202 are electrically and mechanically connected to leadframe 260. This can be accomplished utilizing solder or conductive adhesive, such as silver filled QMI 529HT available from Henkel Corporation.

As shown in FIG. 2B, U-phase power switch 204b, V-phase power switch 206b, and W-phase power switch 208b are situated on leadframe 260 along edge 242a of PQFN package 200. W-phase power switch 208b is situated on W-phase die pad 222a. More particularly, drain 236a of W-phase power switch 208b is situated on W-phase die pad 222a. Similarly, V-phase power switch 206b is situated on V-phase die pad 222b. More particularly, drain 236b of V-phase power switch 206b is situated on V-phase die pad 222b. Also, U-phase power switch 204b is situated on U-phase die pad 222c. More particularly, drain 236c of U-phase power switch 204b is situated on U-phase die pad 222c. Thus, U-phase power switch 204b, V-phase power switch 206b, and W-phase power switch 208b are individually coupled to respective die pads of leadframe 260. As such, W-phase die pad 222a can correspond to W-phase output terminal 212q of PQFN package 200, V-phase die pad 222b can correspond to V-phase output terminal 212p of PQFN package 200, and U-phase die pad 222c can correspond to U-phase output terminal 212o of PQFN package 200, as shown in FIG. 2B.

Also shown in FIG. 2B, U-phase power switch 204a, V-phase power switch 206a, and W-phase power switch 208a are situated on leadframe 260 along edge 242b of PQFN package 200, which intersects edge 242a. U-phase power switch 204a, V-phase power switch 206a, and W-phase power switch 208a are situated on common die pad 228. More particularly, drain 236d of U-phase power switch 204a, drain 236e of V-phase power switch 206a, and drain 236f of W-phase power switch 208a are situated on common die pad 228 of leadframe 260. Thus, common die pad 228 can correspond to VBUS terminal 212a (e.g. a bus voltage input terminal) of PQFN package 200, as shown in FIG. 2B.

Figure 2D:
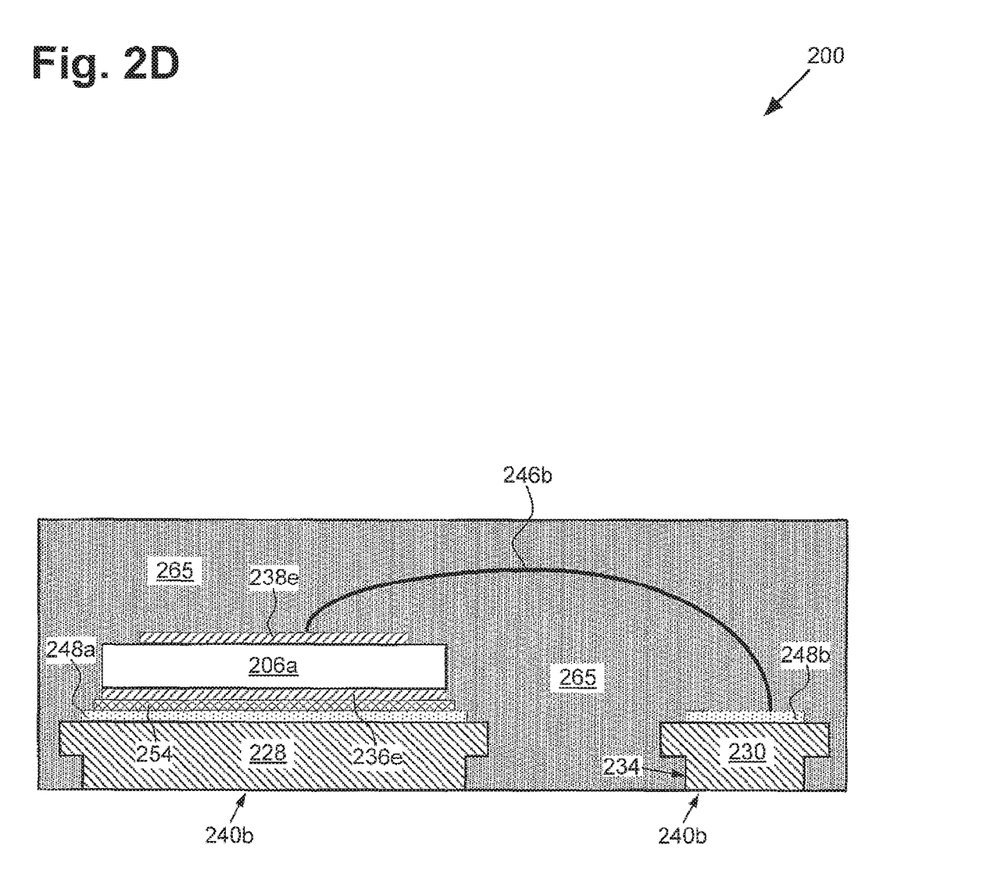
FIG. 2D illustrates a cross sectional view of a portion of an exemplary PQFN package.

An example of this configuration is shown in more detail in FIG. 2D. FIG. 2D illustrates a cross sectional view of a portion of PQFN package 200. The cross sectional view in FIG. 2D corresponds to cross section 2D-2D, of FIGS. 2B and 2C. FIG. 2D shows drain 236e of V-phase power switch 206a connected to common die pad 228 through conductive adhesive 254 and plating 248a of leadframe 260. Conductive adhesive 254 can include silver filled adhesive such as QMI 529HT. Other dies in PQFN package 200 can similarly be connected to leadframe 260.

As shown in FIG. 2B, driver IC 202 is situated on leadframe 260. More particularly, driver IC 202 is situated on driver IC die pad 220 of leadframe 260. Driver IC die pad 220 is larger than driver IC 202 and can therefore accommodate different, larger driver ICs, which may have different features than driver IC 202.

FIG. 2B also shows that wirebonds, such as wirebond 244a electrically and mechanically connect driver IC 202 to VCC terminal 212b, HIN1 terminal 212c, HIN2 terminal 212d, HIN3 terminal 212e, LIN1 terminal 212f, LIN2 terminal 212g, LIN3 terminal 212h, EN terminal 212i, FAULT terminal 212j, RCIN terminal 212k, IM terminal 212l, VSS terminal 212m, VB1 terminal 212r, VB2 terminal 212s, VB3 terminal 212t, and to respective gates of U-phase power switches 204a and 204b, V-phase power switches 206a and 206b, and W-phase power switches 208a and 208b.

Wirebond 244a and similarly depicted wirebonds in FIG. 2B can include, for example, 1.3 mil diameter G1 type Gold (Au) wires. Thicker wires can be utilized for power connections, such as wirebonds 246a, 246b, 246c, 246d, 246e, and 246f (also referred to as "wirebonds 246"). Wirebonds 246 can be, for example, 2.0 mil diameter copper (Cu) wires, such as Maxsoft® LD wires available from Kulicke & Soffa®. Wirebonds 246 can be bonded using bond stitch on ball (BSOB) bonding. As shown in FIG. 2B, multiple wirebonds, such as two wirebonds, can be in parallel with wirebonds 246 to for additional current handling.

U-phase power switch 204b, V-phase power switch 206b, and W-phase power switch 208b are coupled respectively to U-phase power switch 204a, V-phase power switch 206a, and W-phase power switch 208a through leadframe 260.

In FIG. 2B, wirebond 246a electrically and mechanically connects source 238d of U-phase power switch 204a to leadframe 260. More particularly, source 238d is connected via wirebond 246a to leadframe island 236 of leadframe strip 232. Thus, U-phase output node 110a of FIG. 1A is situated on leadframe strip 232 of leadframe 260, where leadframe strip 232 is connected to U-phase die pad 222c of leadframe 260. As such, PQFN package 200 has significant flexibility in arranging wirebond 246a, and other wirebonds, such as wirebond 244b, while avoiding wire shorts due to wire crossing and achieving high electrical and thermal performance. Wirebond 244b electrically and mechanically connects driver IC 202 and leadframe strip 232 of leadframe 260 at leadframe island 236 to provide SW1 to driver IC 202 as shown in FIG. 1A. U-phase output node 110a of FIG. 1A is also situated on leadframe island 236 of leadframe 260. As leadframe island 236 is exposed on bottom-side 240b of PQFN package 200 (shown in FIG. 2C), heat generated at U-phase output node 110a can be effectively dissipated from PQFN package 200.

Similarly, wirebond 246b electrically and mechanically connects source 238e of V-phase power switch 206a to leadframe 260. FIG. 2D illustrates one example of this connection. Source 238e is connected via wirebond 246b to leadframe island 234 of leadframe strip 230 through plating 248b of leadframe 260. Leadframe strip 230 then connects to drain 236b of V-phase power switch 206b through V-phase die pad 222b. A similar connection can be employed for connecting source 238d to drain 236c of U-phase power switch 204b. Wirebond 246b electrically and mechanically connects source 238e of V-phase power switch 206a to leadframe strip 230 at leadframe island 234. Thus, V-phase output node 110b of FIG. 1A is situated on leadframe strip 230 of leadframe 260, where leadframe strip 230 is connected to V-phase die pad 222b of leadframe 260. As such, PQFN package 200 has significant flexibility in arranging wirebond 246b, and other wirebonds, such as wirebond 244c, while avoiding wire shorts due to wire crossing and achieving high electrical and thermal performance. Wirebond 244c electrically and mechanically connects driver IC 202 and leadframe strip 230 of leadframe 260 at leadframe island 234 to provide SW2 to driver IC 202 as shown in FIG. 1A. V-phase output node 110b of FIG. 1A is also situated on leadframe island 234 of leadframe 260. As leadframe island 234 is exposed on bottom-side 240b of PQFN package 200 (shown in FIG. 2C), heat generated at V-phase output node 110b can be effectively dissipated from PQFN package 200.

It is noted that PQFN package 200 can include leadframe islands 234 and/or 236 without leadframe strip 230 and/or 232. For example, leadframe island 234 can be connected to V-phase die pad 222b through a trace on a PCB. It is further noted that PQFN package 200 can include leadframe strip 230 and/or 232 without leadframe islands 234 and/or 236. However, having leadframe strips 230 and 232 with leadframe islands 234 and 236 can offer significant flexibility in arranging wirebonds in PQFN package 200 while achieving high electrical and thermal performance.

In FIG. 2B, wirebond 246c is electrically and mechanically connecting source 238f of W-phase power switch 208a to leadframe 260. More particularly, wirebond 246b electrically and mechanically connects source 238f of W-phase power switch 208a to W-phase die pad 222a on leadframe 260. Thus, W-phase output node 110c of FIG. 1A is situated on W-phase die pad 222a of leadframe 260 with W-phase power switch 208b. As W-phase power switch 208b is adjacent to W-phase power switch 208a, source 238f of W-phase power switch 208a can be coupled to drain 236a of W-phase power switch 208b while easily avoiding wire shorts due to wire crossing and achieving high electrical and thermal performance. This can be accomplished without utilizing a leadframe strip and/or leadframe island. Thus, PQFN package 200 can be made significantly smaller while avoiding arcing between U-phase output node 110a, V-phase output node 110b, and W-phase output node 110c. For example, an additional leadframe strip and/or leadframe island would require a larger PQFN package 200 to maintain sufficient spacing 252 between leadframe strips 230 and 232 so as to prevent arcing (e.g. at least 1 mm).

Furthermore, this configuration does not significantly impact flexibility in arranging wirebonds in PQFN package 200. Also, as W-phase die pad 222a is exposed on bottom-side 240b of PQFN package 200 (shown in FIG. 2C), heat generated at W-phase output node 110c can be effectively dissipated from PQFN package 200. Wirebond 244d electrically and mechanically connects driver IC 202 and source 238f to provide SW3 to driver IC 202 as shown in FIG. 1A.

PQFN package 200 includes a logic ground of leadframe 260 coupled to a support logic circuit of driver IC 202. The logic ground of leadframe 260 includes logic ground terminal 212m. At least wirebond 244g is electrically and mechanically connecting logic ground terminal 212m of leadframe 260 to driver IC 202 and more particularly, is connecting logic ground terminal 212m of leadframe 260 to the support logic of driver IC 202.

PQFN package 200 further includes a power stage ground of leadframe 260 coupled to sources 238c, 238b, and 238a of U-phase power switch 204b, V-phase power switch 206b, and W-phase power switch 208b. The power stage ground of leadframe 260 includes power stage ground terminal 212n, driver IC die pad 220, and leadframe island 233. In FIG. 2B, at least wirebond 246d is electrically and mechanically connecting power stage ground terminal 212n of the power stage ground of leadframe 260 to source 238a of W-phase power switch 208b. At least wirebond 246e is electrically and mechanically connecting source 238a of W-phase power switch 208b to source 238b of V-phase power switch 206b. Also, at least wirebond 246f is electrically and mechanically connecting source 238b of V-phase power switch 206b to source 238c of U-phase power switch 204b. Thus, sources 238a, 238b, and 238c are electrically connected to each other within PQFN package 200.

Also in the present implementation, the power stage ground of leadframe 260 is coupled to gate drivers (e.g. gate drivers 174b in FIG. 1) of driver IC 202. Wirebonds 244e and 244f are connecting source 238c of U-phase power switch 204b to the gate drivers of driver IC 202 through leadframe 260. Wirebond 244c is electrically and mechanically connecting source 238c of U-phase power switch 204b to leadframe island 233 of leadframe 260. Wirebond 244f is electrically and mechanically connecting leadframe island 233 of leadframe 260 to driver IC 202. Connecting source 238c of U-phase power switch 204b to driver IC 202 through leadframe 260, offers flexibility in connecting PQFN package 200. However, it is noted that leadframe island 233 is optional and a wirebond may directly connect source 238c of U-phase power switch 204b to driver IC 202. Furthermore, in some implementations, driver IC 202 optionally has ground 256, which is situated on driver IC die pad 220 of leadframe 260. Ground 256 can be the power stage ground and/or the logic ground. In the implementation shown, where ground 256 is the power stage ground, wirebond 244f may be excluded.

Thus, as described above with respect to FIGS. 1A, 1B, and 2A through 2D, in accordance with various implementations, PQFN packages, can be substantially more complex than typical QFN packages while avoiding wire crossing and wire shorting and achieving high electrical and thermal performance. In doing so, the PQFN packages can achieve complex circuits, such as a single shunt inverter circuit that has a logic ground separate from a power stage ground.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power quad flat no-lead (PQFN) package comprising:
a leadframe; and
a driver integrated circuit (IC) positioned to a driver IC die pad of the leadframe, wherein the driver IC comprises:
a first level shifter configured to output:
a first signal to a first gate driver to drive a first high-side power transistor of a bridge circuit of the PQFN package; and
a second signal to a second gate driver to drive a second high-side power transistor of a bridge circuit of the PQFN package, wherein the first high-side power transistor and the second high-side power transistor are situated on a top-side of a common die pad; and
a second level shifter configured to output:
a third signal to a third gate driver of the driver IC to drive a first low-side power transistor of the bridge circuit of the PQFN package,
wherein a drain of the first low-side power transistor is situated on a first die pad, and the first die pad is electrically connected to a first leadframe strip comprising a first leadframe island, and
wherein at least a portion of the first leadframe strip is exposed at an edge of the leadframe; and
a fourth signal to a fourth gate driver of the driver IC to drive a second low-side power transistor of the bridge circuit of the PQFN package,
wherein a drain of the second low-side power transistor is situated on a second die pad, and the second die pad is electrically connected to a second leadframe strip comprising a second leadframe island, and
wherein at least a portion of the second leadframe strip is exposed at the edge of the leadframe.

2. The (PQFN) package of claim 1, wherein the driver IC further comprises input logic:
coupled to the first level shifter to control the first level shifter to output the first signal to the first gate driver to drive the first high-side power transistor of the bridge circuit of the PQFN package; and
coupled to the second level shifter to control the second level shifter to output the third signal to the third gate driver to drive the first low-side power transistor of the bridge circuit of the PQFN package.

3. The (PQFN) package of claim 1, wherein the driver IC further comprises an undervoltage protection circuit configured to detect a supply voltage undervoltage condition to disable switching of the bridge circuit.

4. The (PQFN) package of claim 1, wherein the driver IC further comprises an overcurrent protection circuit configured to output a signal indicative of an overcurrent condition to disable switching of the bridge circuit.

5. The (PQFN) package of claim 4, wherein the first level shifter is configured to output the signal to the first gate driver at magnitude greater than the second level shifter is configured to output the third signal to the third gate driver.

6. The (PQFN) package of claim 1, wherein the first high-side power transistor corresponds to one of a V-phase power switch, a V-phase power switch and a W-phase power switch of the bridge circuit.

7. The (PQFN) package of claim 1, wherein the first low-side power transistor corresponds to one of a U-phase power switch, a V-phase power switch and a W-phase power switch of the bridge circuit.

8. The (PQFN) package of claim 1, wherein at least one of the first high-side power transistor, the second high-side power transistor, the first low-side power transistor, and the second low-side power transistor corresponds to a fast-reverse epitaxial diode field-effect transistor (FREDFET).

9. The (PQFN) package of claim 1, wherein at least one of the first high-side power transistor, the second high-side power transistor, the first low-side power transistor, and the second low-side power transistor corresponds to an insulated-gate bipolar transistor (IGBTs).

10. The (PQFN) package of claim 1, wherein at least one of the first high-side power transistor, the second high-side power transistor, the first low-side power transistor, and the second low-side power transistor corresponds to a group III-V transistor.

11. A power quad flat no-lead (PQFN) package comprising:
a leadframe;
a common die pad; and
a U-phase power switch, a V-phase power switch, a W-phase power switch, and a driver IC (Integrated Circuit) each positioned to the leadframe, wherein the U-phase power switch, the V-phase power switch, the W-phase power switch are each situated respectively on a first, second and third die pad different from the common die pad,
wherein the driver IC comprises a first level shifter configured to:
output a first signal to a first gate driver to drive the U-phase power switch, wherein the first die pad is electrically connected to a first leadframe strip comprising a first leadframe island;
output a second signal to a second gate driver to drive the V-phase power switch,
wherein the second die pad is electrically connected to a second leadframe strip comprising a second leadframe island; and
output a third signal to a third gate driver to drive the W-phase power switch.

12. The (PQFN) package of claim 11, wherein at least one of the U-phase power switch, the V-phase power switch, and the W-phase power switch corresponds to a low-side switch of a bridge circuit of the PQFN package.

13. The (PQFN) package of claim 11, further comprising:
a second level shifter; and
a second U-phase power switch, a second V-phase power switch, and a second W-phase power switch, wherein:
the second U-phase power switch, the second V-phase power switch, and the second W-phase power switch are each situated on the common die pad,
a second level shifter configured to:
output a fourth signal to a fourth gate driver to drive the U-phase power switch;
output a fifth signal to a fifth gate driver to drive the U-phase power switch; and
output a sixth signal to a sixth gate driver to drive the U-phase power switch; and
at least one of the second U-phase power switch, the second V-phase power switch, and the second W-phase power switch corresponds to a high-side power switch of a bridge circuit of the PQFN package.

14. The (PQFN) package of claim 11, wherein the driver IC further comprises an undervoltage protection circuit configured to detect a supply voltage undervoltage condition to disable switching of a bridge circuit of the PQFN package that comprises the U-phase power switch, the V-phase power switch, and the W-phase power switch.

15. The (PQFN) package of claim 11, wherein the driver IC further comprises an overcurrent protection circuit configured to output a signal indicative of an overcurrent condition to disable switching of a bridge circuit of the PQFN package that comprises the U-phase power switch, the V-phase power switch, and the W-phase power switch.

16. The (PQFN) package of claim 11, wherein at least one of the U-phase power switch, the V-phase power switch, and the W-phase power switch corresponds to a fast-reverse epitaxial diode field-effect transistor (FREDFET).

17. The (PQFN) package of claim 11, wherein at least one of the U-phase power switch, the V-phase power switch, and the W-phase power switch corresponds to an insulated-gate bipolar transistor (IGBTs).

18. The (PQFN) package of claim 11, wherein at least one of the U-phase power switch, the V-phase power switch, and the W-phase power switch corresponds to a group III-V transistor.

* * * * *

UNITED STATES PATENT AND TRADEMARK OFFICE
CERTIFICATE OF CORRECTION

Page 1 of 1

PATENT NO.         : 10,438,876 B2
APPLICATION NO.    : 15/496951
DATED              : October 8, 2019
INVENTOR(S)        : Dean Fernando, Roel Barbosa and Toshio Takahashi It is certified that error appears in the above-identified patent and that said Letters Patent is hereby corrected as shown below:

In the Claims

Column 12, Claim 6, Line 46: "...corresponds to one of a V-phase power..." should be --...corresponds to one of a U-Phase power...--

Signed and Sealed this
Seventeenth Day of November, 2020

Andrei Iancu
*Director of the United States Patent and Trademark Office*